US011049544B2

(12) United States Patent
Devaux et al.

(10) Patent No.: US 11,049,544 B2
(45) Date of Patent: Jun. 29, 2021

(54) ROW HAMMER CORRECTION LOGIC FOR DRAM WITH INTEGRATED PROCESSOR

(71) Applicant: UPMEM, Grenoble (FR)

(72) Inventors: Fabrice Devaux, La Conversion (CH); Gilles Hamou, Grenoble (FR)

(73) Assignee: UPMEM, Grenoble (FR)

( * ) Notice: Subject to any disclaimer, the term of this patent is extended or adjusted under 35 U.S.C. 154(b) by 0 days.

(21) Appl. No.: 16/615,636

(22) PCT Filed: May 18, 2018

(86) PCT No.: PCT/FR2018/051200
§ 371 (c)(1),
(2) Date: Nov. 21, 2019

(87) PCT Pub. No.: WO2018/215715
PCT Pub. Date: Nov. 29, 2018

(65) Prior Publication Data
US 2021/0012832 A1    Jan. 14, 2021

(30) Foreign Application Priority Data

May 24, 2017   (FR) ..................................... 17/70532

(51) Int. Cl.
G11C 11/406        (2006.01)
G06F 13/16         (2006.01)

(52) U.S. Cl.
CPC .... *G11C 11/40615* (2013.01); *G06F 13/1668* (2013.01)

(58) Field of Classification Search
CPC ...................... G11C 11/40615; G06F 13/1668
See application file for complete search history.

(56) References Cited

U.S. PATENT DOCUMENTS 6,463,001 B1    10/2002 Williams
2014/0006704 A1  1/2014 Greenfield et al.
(Continued)

FOREIGN PATENT DOCUMENTS

WO    2017/048441 A1    3/2017
WO    2017 /055732 A1   4/2017

OTHER PUBLICATIONS

Kim Dae-Hyun et al: "Architectural Support for Mitigating Row Hammering in DRAM Memories", IEEE Computer Architecture Letters, IEEE, US, vol. 14, No. 1, Jun. 19, 2015 (Jun. 19, 2015), pp. 9-12, XP011585141, ISSN: 1556-6056, DOI: 10.1109/LCA.2014. 2332177.

(Continued)

*Primary Examiner* — Jay W. Radke
(74) *Attorney, Agent, or Firm* — Phillips Winchester

(57) ABSTRACT

A memory device comprises one or more bank(s), each bank comprising a plurality of DRAM memory rows, the memory device further comprising: an external access port configured to allow an external memory controller to activate and then access the memory rows of each bank; one or more internal processor(s) capable of activating and then accessing the memory rows of each bank; a logic for detecting triggering of the Row Hammer configured to monitor, for each bank, the activation commands from the external memory controller and from one or more internal processor(s), the logic for detecting triggering including memory storage and a logic for sending preventive refresh configured to implement a refresh operation for one or more of the adjacent rows of each identified row by emitting refresh requests instead of the periodic refresh requests generated by the external memory controller, delaying one or more of said periodic refresh requests.

8 Claims, 1 Drawing Sheet

(56) References Cited

U.S. PATENT DOCUMENTS

2019/0228813 A1\* 7/2019 Nale ................... G11C 11/4096
2019/0347019 A1\* 11/2019 Shin ..................... G06F 3/0679
2020/0043545 A1\* 2/2020 Gans ................. G11C 11/40618

OTHER PUBLICATIONS

International Search Report dated Aug. 30, 2018 for PCT/FR2018/051200.

\* cited by examiner

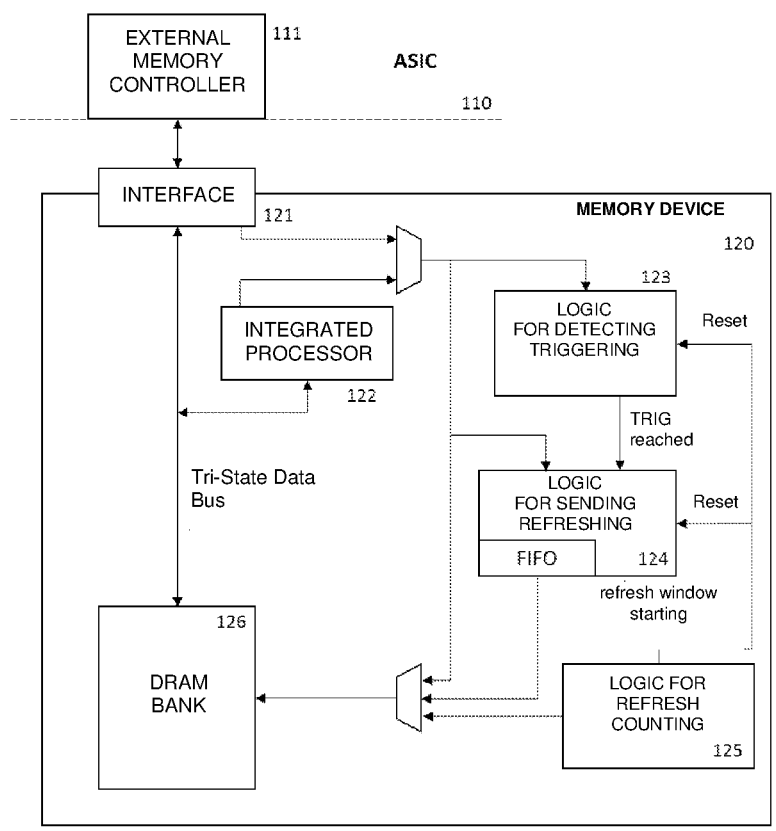

ROW HAMMER CORRECTION LOGIC FOR DRAM WITH INTEGRATED PROCESSOR

BACKGROUND OF THE INVENTION

This description relates to the field of DRAM (dynamic random access memory) circuits with integrated processors.

The Row Hammer effect is the fact that, within a given DRAM memory bank, repeatedly activating a given DRAM row can cause the physically adjacent rows to invert the value of some of their bits. The row that is too activated will be called "aggressor row" and its two adjacent rows will be called "victim rows".

In particular, activating a memory row inside a DRAM bank implies having the bank in a pre-loaded state, this state having previously been reached through a pre-load command, then by playing an activation command. Once activated, the row can be accessed for the purpose of a read or write operation.

If the activations that target a given row are counted, then when this count reaches a certain value, the row becomes an aggressor and the 2 adjacent rows become its victims.

The solution to this problem consists in detecting that a row is about to become an aggressor, and, before that happens, refreshing the two adjacent rows (its potential victims), such refreshes being called in this document "preventive refreshes".

In doing so, and from the point of view of the Row Hammer effect, refreshing two adjacent rows "resets" the number of activations of the potential aggressor.

Regardless of the Row Hammer issue, the DRAM memory needs to be refreshed in any way. The DDR4 specification states that all the rows of a DDR4 bank must be refreshed every 64 ms, the corresponding refreshes being called "periodic refreshes".

Therefore, the Row Hammer issue can only occur if, within a 64 ms time window, a given row is activated enough times to become an aggressor.

Studies on the Row Hammer phenomenon show that the aggression on a victim row is the result of the sum of the aggressions on the two adjacent rows. For example, if it takes 250,000 activations for a row to become an aggressor, the logic for mitigating the Row Hammer should consider 125,000 activations as a trigger value, since two aggressors can "cooperate" to attack the same victim row.

In summary, an intrinsic Row Hammer trigger value, which takes into account the worst possible cases, such as co-aggression, is now an additional parameter that is part of the description of any recent DRAM process.

If, within a refresh window, the number of activations of a given row is about to reach this intrinsic Row Hammer trigger value, then the two adjacent rows must be refreshed preventively.

The US publication 20140/006704A1 describes a solution to mitigate the Row Hammer effect, but it has the following disadvantages:

The method is not suitable for DRAM memory with an embedded processor,

The completely detailed method (and no other method can be directly inferred from this text,) does not allow to detect Row Hammer conditions in relatively simple scenarios, when the parameters are calculated as explained by this precise method, The detailed method completely requires, for each activation command, the classification of the entries of a table, with a few dozen entries. Such a classification is a time-consuming process that would be difficult to achieve in less than 45 ns, the minimum time between two consecutive activations within the same DDR4 bank.

The solution described in US publication 2014/0006704A1 is therefore not suitable for a DRAM with an integrated processor. One of the objectives of this description is to remedy at least partially one or more of these limitations.

The publication WO2017/048441 and the U.S. Pat. No. 6,463,001 address the issue of refreshing a conventional DRAM memory.

The patent application published under WO 2017/055732 outlines how it is feasible to have a processor integrated into a DDR4-compatible DRAM chip.

The US publication 2014/0006704A1 is not suitable for a DRAM with an internal processor, since the external memory controller does not know the activations generated by the DRAM internal processor, while the possibility for a given row to become an aggressor results from the sum:

activations generated by the external memory controller for this given row, and activations generated by the internal processor of the DRAM memory for this given row.

The US publication 2014/0006704A1 does not work in some simple scenarios. The intrinsic trigger value considered is 125,000 row activations, and all significant parameters are calculated according to the method described in the US publication 2014/0006704A1.

The time window N starts at time T.

The $20000^{th}$ row is refreshed between T+16 ms and T+32 ms.

Between the times T+32 ms and T+64 ms, the $20000^{th}$ row is activated 120000 times, i.e. less than the intrinsic trigger value 125000, so no preventive refresh is initiated for its neighbouring rows.

According to the time window N, the new time window N+1 starts at T+64 ms, and the detection logic table is initialized, since it is initialized at the beginning of each time window (as explained in the US publication 2014/0006704A1), this initialization leading in particular to the zeroing of the activation counter associated with the $20000^{th}$ row.

Between the times T+64 ms and T+80 ms, the $20000^{th}$ row is not yet refreshed (it will be refreshed between 64+16 ms and 64+32 ms), and the $20000^{th}$ row is activated 10000 times more, so:

The $20000^{th}$ row has been activated more than 125,000 times (130,000 times) over a period of time of less than 64 ms (from T+32 ms to T+80 ms) and yet the need for preventive refreshes for its two neighbours has not been discovered by the logic proposed by the US publication 2014/0006704A1.

The US publication 2014/0006704A1 is not suitable for integration into a DRAM. An external DRAM controller will typically be part of an ASIC manufactured using a process adapted to create fast logic, such a process being called a "logic process".

DRAMs are manufactured with specialized processes, allowing the capacitors used for memory cells to be built, and the logic built using such processes is much slower than if it were built using a logical process.

Therefore, an algorithm implemented in a DRAM will typically be much slower than the same algorithm implemented in an ASIC.

The only method explained in the US publication 2014/0006704A1 requires sorting a table of row activation counts (there is no practical explanation anywhere to explain how to get rid of the table sorting).

Sorting is an expensive procedure, which can be fast enough if implemented on a logical process, but it is probably not fast enough when implemented on a DRAM process, especially considering that the entire algorithm must be executed in less than 45 ns, the minimum time between two activation commands on the same bank.

SUMMARY OF THE INVENTION

One of the realization of the description presented is to solve at least partially one or more of the problems of the prior art.

According to one aspect, a memory device is provided comprising one or more bank(s), each bank comprising a plurality of DRAM memory rows, the memory device further comprising: an external access port configured to allow an external memory controller to activate and then access the memory rows of each bank; one or more internal processor(s) capable of activating and then accessing the memory rows of each bank; a detection logic triggering of the Row Hammer configured to monitor, for each bank, the activation commands from the external memory controller and from one or more internal processor(s), the detection logic triggering including memory storage: one or more table(s) indicating, for each row of a subset of rows of each bank, a count value based on the number of activation commands for the row, where the subset of rows associated with the count value in one or more table(s) is dynamically modified by the detection logic of the Row Hammer based on the count values, to indicate the most frequently activated rows, based on the detection of activation commands for each row of each bank; an additional count value indicating the maximum number of activation commands that could have been placed on one of the rows that were not part of said subset of rows at that time; wherein the detection logic triggering of the Row Hammer is configured to compare each of said count values with a threshold level in order to identify one or more rows within the subset of rows, and to initiate a refresh operation of one or more of the rows adjacent to each identified row; and wherein a logic for sending preventive refresh configured to implement a refresh operation for one or more of the adjacent rows of each identified row by emitting refresh requests instead of the periodic refresh requests generated by the external memory controller, thereby delaying one or more of said periodic refresh requests.

According to one of the embodiments, one or more table(s) include(s) an entry associated with each row of the subset of rows, each entry including said count value, wherein the number of entries in the additional table(s) is less than one hundredth of the number of rows in each bank.

According to one of the embodiments, the amount of time by which periodic refresh requests are delayed does not exceed a maximum amount that allows each memory bank to correctly retain this data over time.

According to one of the embodiments, the logic for sending preventive refresh includes a memory storing an indication on the row, or adjacent rows of each of the rows identified as requiring refresh.

According to one of the embodiments, an external protocol used by the external memory controller allows the memory device to take the initiative to generate refreshes.

According to one of the embodiments, the detection logic triggering of the Row Hammer is configured after each activation command from the external memory controller or one of the internal processors: to change the count value associated with the row targeted by the activation command if the row targeted belongs to the subset of rows; or to replace an entry in one or more of the tables with an entry corresponding to the row targeted by the activation command if the count value of that entry is equal to the additional count value; or to change the additional count value if the target layer does not belong to one of the layer subsets and none of the count values in one or more of the tables is equal to the additional count value.

According to an additional aspect, a method is provided to protect a memory device from the Row Hammer effect, the memory device comprising one or more DRAM bank(s), each of the banks comprising several memory rows, the method comprising: monitoring, by means of the detection logic triggering of the Row Hammer and for each bank, row activation commands generated by an external memory controller and/or by one or more internal processor(s); storing, by means of the detection logic triggering of the Row Hammer, one or more table(s) indicating, for each row of a subset of rows of each bank, a count value based on the number of activation commands for the row, wherein the subset of rows associated with the count value in one or more table(s) is dynamically modified by the detection logic triggering of the Row Hammer based on the count values, to indicate the most frequently activated rows based on a detection of the activation commands for each row of each bank; storing, by a detection logic triggering of the Row Hammer, an additional count value indicating the maximum number of activation commands that could have been applied to any of the rows not currently part of said subset of rows; comparing, by a detection logic triggering of the Row Hammer, each of the count values with a threshold level to identify one or more row(s) in one or more table(s); and triggering, by a trigger detection logic, an operation to refresh one or more row(s) adjacent to each of the identified rows.

According to one of the embodiments, the method also includes implementing, using a logic for sending preventive refresh, a refresh operation for one or more row(s) adjacent to each of the identified rows by emitting refresh requests instead of periodic refresh requests generated by the external memory controller, thereby delaying one or more of said periodic refresh requests.

According to one of the embodiments, the method also includes: after each activation command emitted by the external memory controller or by one of the internal processors: changing the count value associated with the row targeted by the activation command if the row targeted belongs to the subset of rows; and replacing an entry in one or more table(s) with an entry corresponding to the row targeted by the activation command if the count value of that entry is equal to the additional count value; and changing the additional count value if the row targeted does not belong to the subset of rows and none of the count values in one or more table(s) is equal to the additional count value.

BRIEF DESCRIPTION OF THE DRAWINGS

The advantages and previous and other characteristics will be apparent from the following detailed description of the embodiments, provided as an example without limitation, with reference to the associated drawing, in which:

FIG. 1 schematically illustrates a part of a computing system comprising a memory device that integrates processors according to an exemplary embodiment.

DETAILED DESCRIPTION

General

For each DRAM bank, the embodiments described below, for example, include two blocks:
A trigger detection unit (or logic), and
A refresh sending unit (or logic)
where the trigger detection unit feeds the refresh sending unit.

For each activation command concerning the bank, the trigger detection unit, detailed below, indicates whether the row targeted by this activation command has potentially reached the trigger value (otherwise known as the "threshold level"). The term "potentially" reflects the fact that false positives are possible, but without consequence since they are sufficiently infrequent, as shown below.

The refresh sending unit includes, for example, a FIFO, referred to here as the preventive refresh FIFO, and when an activation command, targeting a given row, is marked as having potentially reached its trigger value, then the two indexes of the two neighbouring rows of this given row are calculated and pushed into this FIFO.

When the preventive refresh FIFO is not empty, preventive refresh shall be emitted, but the DRAM bank may initiate these preventive refreshes on its own initiative:
From a protocol point of view, the DRAM memory chip is a slave of the external DRAM memory controller, and having a bank of a DRAM chip capable of performing refreshes on its own initiative would break the protocol entirely.

The external memory controller that is connected to the DRAM regularly generates periodic refresh requests. A periodic refresh request does not specify the index of the row to be refreshed: this index is generated by an internal DRAM logic called refresh counter logic (since it is usually just a counter, called a "refresh counter").

So in the embodiments of this present invention, each bank has its own refresh counter logic and each time a DRAM bank receives a periodic refresh request generated by the external DRAM controller then:
if the preventive refresh FIFO for this bank is not empty then the index of the row to be refreshed is not provided by the refresh counter, but is removed from the preventive refresh FIFO, the refresh counter of this bank remaining unchanged.
if the preventive refresh FIFO is empty then the index of the row to be refreshed is provided by the refresh counter of this bank, this one being updated.

Since the execution of preventive refreshes is ended by periodic refreshes, the trigger value must be reduced by the number of activations that can be made during the worst-case delay between the discovery that a periodic refresh is required and its actual execution, this worst-case delay resulting from:
the fact that several preventive refreshes could be accumulated in the FIFO, this being facilitated by the fact that the preventive refreshes are generated in pairs
the need to wait for a request for periodic refresh for the effective realization of each pending preventive refresh.

Ignoring the intrinsic latency of the logic, the worst-case delay is about Max_Triggered×2×Max_Timed Refresh_Period, where:
Max_Triggered is the number of rows of a bank that can be activated enough times to reach the trigger value within a 64 ms time window,
Max Timed Refresh Period is the maximum time between two periodic refresh requests.

Extension of the Refresh Window

The effective execution of preventive refreshes delays periodic refreshes, but the maximum delay is small enough to be inconsequential:
Since a typical DRAM bank has 65536 rows, the external memory controller generates on average, for a bank, a periodic refresh every 976 ns (64 ms/65536).
Typically an activation command can be emitted every 45 ns to a given bank, which means that for a time window of 64 ms, less than 1423000 activation commands can be emitted to the same bank, this number being called Max activate in window.
Considering an intrinsic value of Row Hammer of 125,000, this means that in a 64 ms window, there can be a maximum of 11 aggressors in a given DRAM bank.
Considering the previous example, in the worst case, instead of refresh 65536 rows in 64 ms, then 65536+(11×2) rows can be refreshed, which leads to the extension of the refresh window from 64 ms to 64,022 ms. Such a small extension is absolutely not a problem since the 64 ms figure is a conservatively low value.

Embodiment of FIG. 1

FIG. 1 shows a device according to the present invention.
An external memory 111 controller, which is part of an ASIC 110, for example, is coupled to a memory device 120 through a bus attached to the interface of the memory device 121 of the memory device 120.
A DRAM bank 126 can be accessed by the external memory controller 111 and the integrated processor 122.
A detection logic triggering 123 monitors the activation commands generated by the external memory controller 111 and the integrated processor 122.
The detection logic triggering 123 indicates, through the assertion of a "TRIG reached" signal, when the activation of the currently activated row implies that this row can potentially reach the triggering value.
The logic for sending refresh 124 receives the "TRIG reached" signal and then determines the indexes of the two rows that are adjacent to the row "about to become" an aggressor, then for example pushes these two indexes into the FIFO of the logic for sending refresh 124.
For example, FIFO is emptied by pre-empting the periodic refresh slots. The corresponding refreshes are not lost, for example, but simply delayed, since the refresh counter logic 125 is not updated.

The Unit (or Logic) for Detecting Triggering

As it will become apparent later, the algorithm used by the unit for detecting triggering is for example approximate, and to compensate for this, the actual trigger value retained Trig_Eff is for example:
initially based on half the intrinsic triggering value, the reason for this being detailed below,
further reduced to take into account the worst-case delay to have a preventive refresh actually performed, as previously explained. Since the worst-case delay mainly depends on the maximum number of pending preventive refreshes, which depend on Trig Eff, the exact Trig Eff value is for example calculated iteratively.

The practical consequence is that more preventive refresh requests than strictly necessary could be emitted. This is not a problem since the number of these preventive refresh requests remains marginal compared to the number of periodic refreshes:

since preventive refreshes steal periodic refresh slots, there is no performance penalty resulting from the emission of unnecessary preventive refreshes the only practical impact is that the 64 ms refresh window can be extended more than strictly necessary. This is without consequence since this extension remains very small in percentage terms.

While it generates false positives, the proposed algorithm does not generate false negatives, unlike the system described in the US publication 2014/0006704A1.

Algorithm of the Unit (or Logic) for Detecting Triggering

The logic unit detection logic triggering includes, for example, a table, the RACT (Row Activate Count Table) which has Nbr of entries entered, where Nbr_of_entries is for example calculated as follows:

Nbr_of_entries=INT (Max activate inwindow/Trig Eff)

Where the INT function returns its entry value rounded to the next whole value less than or equal to.

For example, each RACT entry contains two fields:

A ROW COUNT field that is large enough to contain a value up to Trig Eff,

A ROW INDEX field that is large enough to contain all possible values of row indexes, and an additional value that is never a row index, called no_row.

In addition, the detection logic triggering includes, for example, a register called OTHER-ROWS-COUNT, large enough to contain a value up to TrigEff−1.

Any periodic time reference can be used, but for the simplicity of explanation, in a bank, a refresh window is said to be started for example when:

the bank refresh counter logic at this time indicates row 0, a periodic refresh request is generated by the external memory controller.

Each time a refresh window starts, the detection logic the trigger, for example:

sets the ROW COUNT fields of all RACT entries to zero initializes the ROW INDEX fields of all RACT tables to no row, sets the OTHER_ROWS_COUNT register to zero.

Each time an activation command, aiming at a row with an index J, is executed by a bank, then the detection logic triggering reads for example the RACT entries to achieve a first objective and a second objective, the second being taken into account only if the first is not reached:

The first objective is to find a RACT entry whose ROW INDEX field has the value J, The second objective is to find a RACT entry whose ROW COUNT field is equal to OTHER_ROWS_COUNT.

First Objective Achieved

As soon as the first objective is reached, then the reading of the entries is stopped and:

the ROW COUNT field of the found entry is incremented, if the value of the ROW COUNT field of the found entry is equal to Trig Eff, then:

the ROW INDEX field of the found entry is for example set to no row, the row indexes of the two neighbors in row J are pushed into the preventive refresh FIFO, for example.

First Objective not Achieved is Second Objective Achieved

In the following explanation, the index of the RACT table of the found entry is called Fidx (Found Index), so we have:

OTHER_ROWS_COUNT==RACT[Fidx].ROWCOUNT

The detection logic triggering then performs:

RACT[Fidx].ROWCOUNT is incremented,

RACT[Fidx].ROWINDEX is set to J.

First and Second Objectives not Achieved

OTHER_ROW_COUNT is incremented

In this algorithm, a row is always associated with an activation counter, a row R for example being:

is associated with the number of activations contained in the ROW COUNT field of a RACT entry whose ROW INDEX field is equal to R, or associated with the number of activations contained in the OTHER ROWS COUNT register.

The algorithm ensures, for example, that the number commonly associated with a row is always greater than or equal to the number of actual activations since the beginning of the refresh window.

The algorithm also ensures, for example, that OTHER ROWS COUNT is smaller than the smallest RACT.ROW-COUNT fields, so the algorithm ensures that if the actual number of activations of the Rank R reaches Trig Eff, this will happen in a RACT entry, and not in the OTHER_ROWS_COUNT register.

Sizing the FIFO Preventive Refresh

Since preventive refresh requests potentially accumulate in the preventive refresh FIFO, in some embodiments an upper limit to the maximum number of preventive refresh requests that can be pushed in this FIFO is determined, in order to properly size it.

An entry only reaches the Trig Eff value by counting Trig_Eff activations, potentially targeting different rows (this is how false positives can happen) or by targeting a single row (and it is certainly a true positive).

It is therefore impossible for the detection logic triggering to generate more than one preventive refresh pair without entering RACT.

Alternative Algorithm

In the algorithm described above, the register value OTHER_ROWS_COUNT is for example necessarily less than or equal to the smallest ROW_COUNT field of the RACT entries.

So OTHER_ROW_COUNT cannot reach Trig Eff, because otherwise the value would have resulted in an additional RACT entry.

The detection logic triggering is basically a cache, whose associativity is equal to the number of entries. The algorithm previously explained has its reduced associativity each time an entry reaches Trig Eff, the entry being effectively removed since:

Its ROW INDEX is initialized to no row: no activated row can reach this entry anymore Its ROW_COUNT field remains at the value Trig_Eff: it cannot be equal to OTHER ROWS COUNT.

The following variation of the initial algorithm maintains the constant associativity by recycling the RACT entries that reach Trig_Eff:

First Objective Achieved

As soon as the first objective is reached, then the reading of the RACT entries is stopped and:

If the value of the ROW COUNT field of the found entry is equal to Trig Eff−1, then:

The ROW INDEX field of the found entry is for example set to no row,

The ROW COUNT field [of] the entry found is for example set to the value contained by OTHER ROWS COUNT, The row indexes of the two neighbors of the row J are for example pushed into the FIFO for preventive refresh.

Otherwise the ROW_COUNT field of the found entry is incremented.

First Objective not Achieved and Second Objective Achieved

The detection logic triggering then implements, for example, the following:

RACT[Fidx].ROWCOUNT is incremented,
RACT[Fidx].ROWINDEX is set to J.

First Objective and Second Objective not Achieved

OTHER ROWCOUNT is for example incremented

Sizing the Preventive Refresh FIFO for the Alternative Algorithm

This alternative algorithm maintains constant associativity instead of gradually reducing it, and therefore necessarily leads to fewer false positives. Therefore, it cannot generate more preventive refreshes than the initial algorithm, and therefore cannot generate more than two preventive refreshes per RACT entry.

Justification of the Trig Eff Calculation

The exposed logic is able to detect if a row has reached TrigEff So, when a new refresh window starts, the maximum "activation past" of any row is worth up to Trig Eff trig−1, since such a value does not yet generate preventive refresh So, before reaching the value Trig_Eff in a given refresh window, a row may have actually accumulated (Trig Eff−1)+(Trig Eff−1), the first value (Trig_Eff−1) being inherited from the previous refresh window. So the logic will actually detect only reliably (Trig_Eff×2)−1 activations, explaining why the iterative calculation Trig Eff for example starts from half the intrinsic trigger value.

Generalizations

The embodiments of this description have been described in the context of DRAM banks, but obviously the techniques described here could be applied to any memory array that would be equivalent to a high-density DRAM bank (having a refresh operation and submitted to the Row Hammer effect).

References have been made to the DDR4 protocol, for example, in different parts of this document. Obviously, the techniques described here could be applied to all affiliated memory protocols, such as:

DDR, DDR2, DDR3, DDR4 in their low power versions,
GDDR, GDDR2, GDDR3, GDDR4, GDDR5,
HBM.

In addition, the embodiments described here could be applied to memory devices, with integrated processors, using protocols that allow DRAM to take initiatives to perform refreshes, such as the HMC protocol. In this case, the preventive refresh sending unit described here can be omitted, only the triggering detection unit remaining.

To simplify, a 64 ms refresh window was considered, as this value is currently used. Obviously, the embodiments described here could be applied to any refresh window duration that would be used by a given DRAM technology, and even to a DRAM where refresh times continuously adapt to the variation of external parameters, such as temperature, voltage, radiation level, etc. . . .

Similarly, the number of rows equal to 65536 was given as an example because it is representative of the DRAMs currently manufactured. Obviously, the embodiments described here could be applied independently of the number of rows present in the bank.

The algorithm presented so far and its variations can be modified in many ways while remaining within the scope of the invention. The following list provides examples of such changes that can be implemented individually or combined in any sub-combination, this list is given as an example and not as a limitation:

Factor some of the material resources described on several DRAM banks,

Replace a table with different fields with different tables with less fields,

Replace a table with different smaller tables, the algorithm being modified to handle several entries at once Use a valid bit instead of a no row value, this valid bit being positioned on an additional field of each entry, or in an additional table, Count activation commands instead of counting them, with the RACT ROW COUNT field and the OTHER ROWS COUNT register initialized with a number of activation commands allowed for the refresh window, Group the rows into topologically adjacent row packages, the activation being followed at the row package level, and when the number of activation reaches Trig Eff, then:

All rows of the aggressors package are refreshed

The two rows that are adjacent to the attacker package are refreshed (or the two corresponding rows are refreshed, if the refreshes are managed at the granularity level of the row package).

The invention claimed is:

1. A memory device comprising one or more banks, each bank comprising several rows of DRAM memory, the memory device further comprising:

an external access port configured to allow an external memory controller to activate and then access the memory rows of each bank;

one or more internal processors capable of activating and then accessing the memory rows of each bank, the memory device being characterized in that it comprises:

a detection logic triggering of the Row Hammer configured to monitor, for each bank, activation commands emitted by the external memory controller and/or by one or more internal processors, the detection logic triggering of the Row Hammer including memory storing:

one or more tables indicating, for each row of a subset of rows of each bank, a count value based on the number of activation commands for the row, wherein the subset of rows associated with the count value in one or more tables is dynamically modified by the detection logic triggering of the Row Hammer based on the count values, to indicate the most frequently activated rows based on a detection of activation commands for each row of each bank; and an additional count value indicating the maximum number of activation commands that could have been placed on any row not in said sub-set of rows, wherein the detection logic triggering of the Row Hammer is configured to compare each of said count values with a threshold level in order to identify one or more rows within the subset of rows, and to trigger an operation to refresh one or more adjacent rows in each identified row; and a logic for sending preventive refresh configured to implement a refresh operation for one or more of the adjacent rows of each identified row by emitting refresh requests instead of the periodic refresh requests generated by the external memory controller, thereby delaying one or more of said periodic refresh requests.

2. The memory device according to claim 1, wherein one or more tables comprise an entry associated with each row of the sub-set of rows, each entry comprising said count value, wherein the number of entries of said one or more tables is less than one hundredth of the number of rows of each bank.

3. The memory device according to claim 1, wherein the duration for which said periodic refresh requests are delayed does not exceed a maximum duration that allows each of the memory to correctly retain its data over time.

4. The memory device according to claim 1, wherein the logic for sending preventive refresh comprises a FIFO memory storing, for each identified row, an indication of one or more adjacent row(s) to be refreshed.

5. The memory device according to claim 1, wherein an external protocol used by the external memory controller allows the memory devices to take the initiative to generate refresh operations.

6. The memory device according to claim 1, wherein the detection logic triggering of the Row Hammer is configured, after each activation command emitted by the external memory controller or by one of the internal processors, to:
   modify the count value associated with the row targeted by the activation command if the row targeted is part of the subset of rows; and
   replace an entry in one or more table(s) with an entry corresponding to the row targeted by the activation command if the count value of this entry is equal to the additional count value; and
   change the additional count value if the targeted row is not part of the subset of rows and none of the count values in one or more table(s) is equal to the additional count value.

7. A method for protecting a memory device from the Row Hammer effect, the memory device comprising one or more bank(s), each bank comprising a plurality of DRAM memory rows, the method comprising the steps of:
   monitoring, using a detection logic triggering of the Row Hammer and for each bank, row activation commands emitted by the external memory controller and/or by one or more internal processor(s) of the memory device, each row activation command causing the row of said bank to be activated before being accessed by the external memory controller or by one or more internal processor(s);
   storing, using the detection logic triggering of the Row Hammer, one or more table(s) indicating for each row of a subset of rows of each bank, a count value based on the number of activation commands for the row, wherein the subset of rows associated with a count value in one or more table(s) is dynamically modified by the detection logic triggering of the Row Hammer based on the count values, to indicate the most frequently activated rows based on the detection of activation commands for each row of each bank;
   storing, using the detection logic triggering of the Row Hammer, an additional count value indicating the maximum number of activation commands that could have been aimed at any row not belonging to said sub-sets of rows;
   comparing, using the detection logic triggering of the Row Hammer, each of the count values with a threshold level in order to identify one or more row(s) in one or more table(s);
   triggering, using the detection logic triggering of the Row Hammer, an operation to refresh one or more row(s) adjacent to the identified row; and
   implementing, using a logic for sending preventive refresh, the refresh operation for one or more adjacent row(s) of each identified row by emitting refresh requests instead of the periodic refresh requests generated by the external memory controller, thereby delaying one or more of said periodic refresh requests.

8. The method according to claim 7, further comprising, after each activation command emitted by the external memory controller or by one of the internal processors, the steps of:
   changing the count value associated with the row targeted by the activation command if the row targeted is part of the subset of rows; and
   replacing an entry in one or more table(s) with an entry corresponding to the row targeted by the activation command if the count value of this entry is equal to the additional count value; and
   changing the additional count value if the target layer is not part of the subset of rows and none of the count values in one or more table(s) is equal to the additional count value.

* * * * *